(12) United States Patent
Wu et al.

(10) Patent No.: US 7,089,999 B1
(45) Date of Patent: Aug. 15, 2006

(54) HOOD RETAINING STRUCTURE FOR HEAT-DISSIPATING DEVICE

(75) Inventors: Wen-Yuan Wu, Taipei (TW); Hung-Ming Chou, Taipei (TW)

(73) Assignee: Chaun-Choung Technology Corp., Taipei (TW)

(*) Notice: Subject to any disclaimer, the term of this patent is extended or adjusted under 35 U.S.C. 154(b) by 0 days.

(21) Appl. No.: 11/075,651

(22) Filed: Mar. 10, 2005

(51) Int. Cl.
*F28F 7/00* (2006.01)
*F24H 3/06* (2006.01)

(52) U.S. Cl. .................. 165/80.3; 165/122; 165/185; 165/67

(58) Field of Classification Search ............. 165/80.3, 165/185, 121, 122, 104.21, 67, 77, 104.33, 165/104.34; 361/695, 697; 257/726–727; 248/457–458; 24/327
See application file for complete search history.

(56) References Cited

U.S. PATENT DOCUMENTS

| | | | |
|---|---|---|---|
| 6,062,301 A * | 5/2000 | Lu | 165/80.3 |
| 6,330,905 B1 * | 12/2001 | Lin et al. | 165/80.3 |
| 6,341,644 B1 * | 1/2002 | Lo et al. | 165/80.3 |
| 6,667,884 B1 * | 12/2003 | Lee et al. | 361/697 |
| 6,672,374 B1 * | 1/2004 | Lin | 165/121 |
| 6,745,824 B1 * | 6/2004 | Lee et al. | 165/104.14 |
| 6,935,410 B1 * | 8/2005 | Lee et al. | 165/80.3 |
| 2002/0139518 A1 * | 10/2002 | Lee et al. | 165/121 |
| 2004/0194926 A1 * | 10/2004 | Lee et al. | 165/80.3 |

* cited by examiner

*Primary Examiner*—Tho Duong

(57) ABSTRACT

A hood retaining structure for a heat-dissipating device. The heat-dissipating device includes a heat sink with at least one heat-dissipating fin set, and each heat-dissipating fin set includes a plurality of heat-dissipating fins erected vertically. The hood retaining structure is arranged on the heat-dissipating fins to retain a hood thereon and a fan is able to retain to the hood. The hood retaining structure includes a dent defined on an outer side of each heat-dissipating fin such that a retaining groove is defined after the heat-dissipating fin are assembled and at least one retaining rod and at least one retaining hook provided on lateral sides of the hood, the retaining rod and the retaining hook being configured to lock into the retaining groove. The retaining hook includes a push tab.

5 Claims, 6 Drawing Sheets

HOOD RETAINING STRUCTURE FOR HEAT-DISSIPATING DEVICE

BACKGROUND OF THE INVENTION

1. Field of the Invention

The present invention relates to a hood retaining structure for heat-dissipating device, and more particularly to a hood retaining structure for heat-dissipating device such that a hood can be easily assembled and disassembled to the heat-dissipating device.

2. Description of Related Art

The computer system generally comprises central processing unit (CPU) on motherboard there for computation and processing. The CPU will generate considerable heat as the computation speed thereof is rapidly increased. Therefore, heat-dissipating device is provided for the CPU and conveys the heat generated by CPU to the ambient outside the computer mainframe, whereby the performance of the CPU is not degraded by high temperature.

FIG. 1 is a sectional view of a prior art heat-dissipating device 10a, which comprises a heat-dissipating block 1a made of material with fast heat dissipation and low heat conductance such as aluminum, and a heat-dissipating fin set 3a on the heat-dissipating block 1a. The heat-dissipating fin set 3a comprises a plurality of fins 31a with equal pitch therebetween. A dent 11a is defined on bottom of the heat-dissipating block 1a and a heat-conducting block 2a is arranged in the dent 11a. The heat-conducting block 2a is made of material of slow heat dissipation and high heat conductance such as aluminum. Moreover, the heat-dissipating device 10a further comprises a hood 4a and a heat-dissipating fan 5a.

The heat-dissipating device 10a is then assembled on the CPU 20a with the heat-conducting 2a is attached to top of the CPU 20a. The high heat conductance property of the copper heat-conducting 2a fast conveys the heat generated by the CPU 20a to the heat-dissipating block 1a. The heat is then dissipated to external ambient by the excellent heat dissipation ability of the aluminum heat-dissipating block 1a and the heat-dissipating fin set 3a. Therefore, the heat-dissipating device 10a has satisfactory heat conductance and heat dissipation ability.

However, the heat-dissipating fan 5a is generally retained to the hood 4a by bolt when the hood 4a is assembled to the heat-dissipating fin set 3a. The assembling and disassembling of the heat-dissipating fan 5a is cumbersome. It is desirable to provide a retaining structure to fast assemble and disassemble the hood.

SUMMARY OF THE INVENTION

The present invention provides a hood retaining structure for heat-dissipating device such that a hood can be easily assembled and disassembled to the heat-dissipating device without using bolt unit.

Moreover, the present invention provides a hood retaining structure for heat-dissipating device such that a fan can be easily assembled and disassembled to the hood without using bolt unit.

Accordingly, the heat-dissipating device according to the present comprises a plurality of heat-dissipating fins erected vertically to form two heat-dissipating fin sets. The hood retaining structure is arranged on the heat-dissipating fins to retain a hood thereon. The hood retaining structure includes a dent defined on an outer side of each heat-dissipating fin such that a retaining groove is defined on each heat-dissipating fin set after the heat-dissipating fins are assembled and at least one retaining rod and at least one retaining hook provided on lateral sides of the hood, the retaining rod and the retaining hook being configured to lock into the corresponding retaining groove. The retaining hook includes a push tab. To retain the hood atop the heat-dissipating device, the retaining rod on one side of the hood is first pivotally connected to the retaining groove on one side of the heat-dissipating fins. Afterward, the retaining hook on another side of the hood is embedded into the retaining groove on one side of other heat-dissipating fins, thus retaining the hood atop the heat-dissipating device.

Moreover, a plurality of four guiding rods are integrally formed on four corners of the hood and corresponding to the retaining hole defined on the fan. To assemble the fan on the hood, the guiding rods pass corresponding retaining hole to retain the fan. Therefore, the fan can be easily assembled to and disassembled from the hood.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
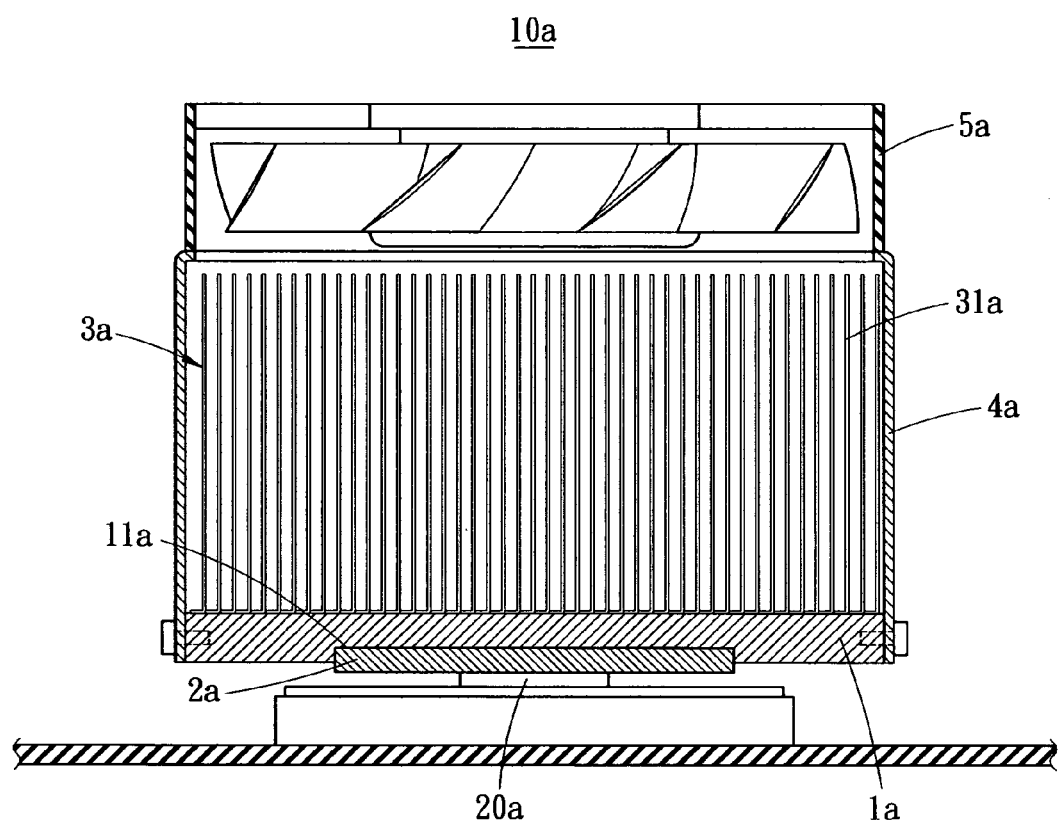
FIG. 1 is a sectional view of a prior art heat-dissipating device.
Figure 2:
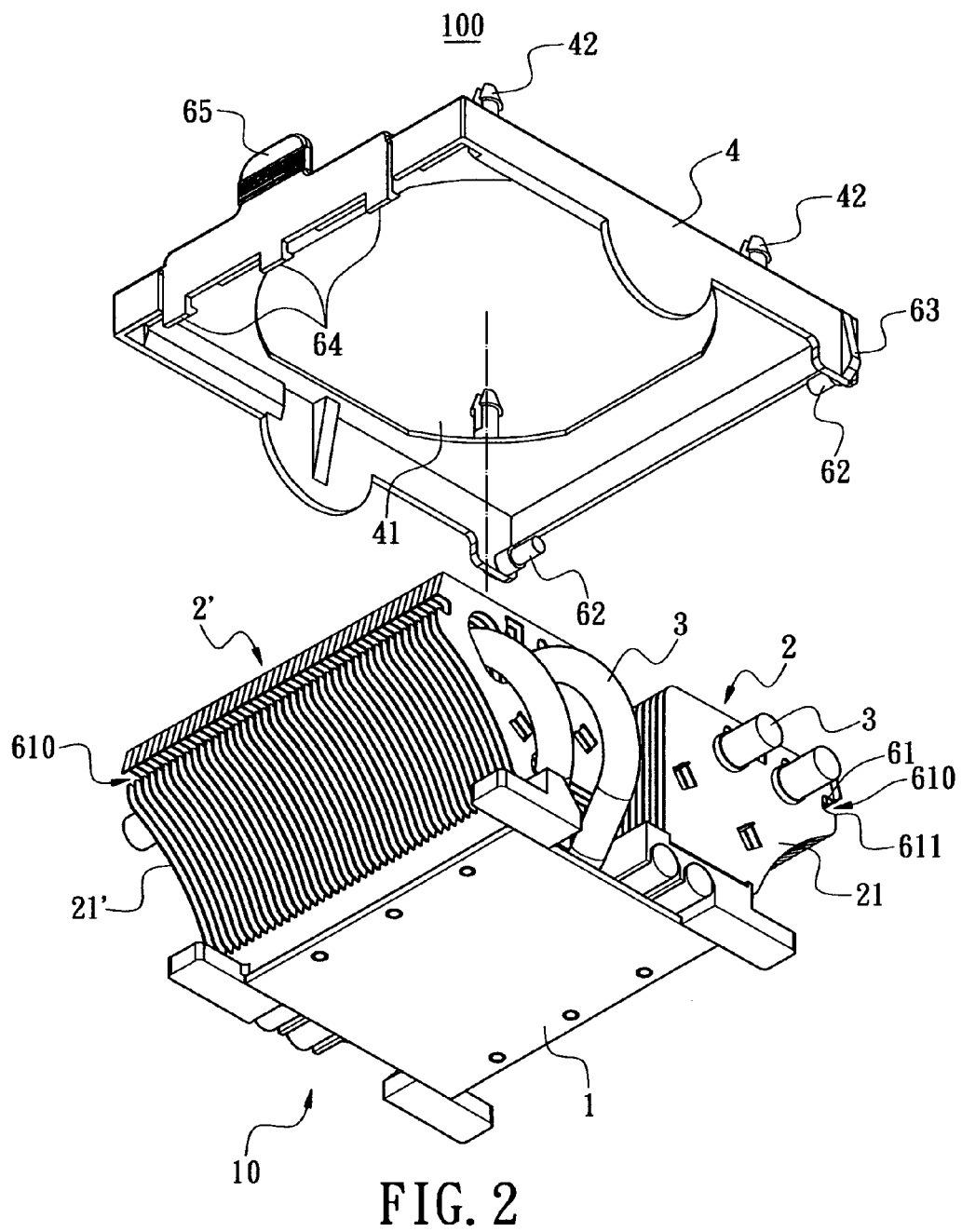
FIG. 2 shows a perspective view of the heat-dissipating device and the hood before assembling.

The present invention provides a hood retaining structure for heat-dissipating device. As shown in FIG. 2, the heat-dissipating device 10 comprises a heat sink 10 having a heat-dissipating block 1 with at least one heat-dissipating fin set 2. In the shown preferred embodiment, there are two heat-dissipating fin sets 2, 2' arranged in juxtaposition. Each of the heat-dissipating fin sets 2, 2' comprises a plurality of heat-dissipating fins 21, 21' erected vertically. Moreover, heat pipes 3 pass through the heat-dissipating fin sets 2, 2' and the heat-dissipating block 1 and each heat pipe 3 has wick structure and working fluid therein. A hood 4 is arranged atop the heat-dissipating fin sets 2, 2' and the hood 4 functions to retain a fan 5. The hood 4 has a through hole 41 defined at center thereof and the airflow from the fan 5 will flow through the through hole 41 to cool the heat-dissipating fins 21, 21'.

In the present invention, the hood 4 is retained to the heat-dissipating fin sets 2, 2' by a hood retaining structure. The hood retaining structure comprises a dent 61 defined on an outer side of each heat-dissipating fin, retaining rods 62 and retaining hooks 64 provided on lateral sides of the hood 4. The dents 61 together form a retaining groove 610 on each heat-dissipating fin set 2, 2' when the heat-dissipating fins 21, 21' are arranged in rows. A push tab 65 is provided atop the retaining hook 64, and the hood 4 comprises rib 63 corresponding to outer side of each retaining rod 62 to reinforce the structure strength of the retaining rod 62.

Figure 5:
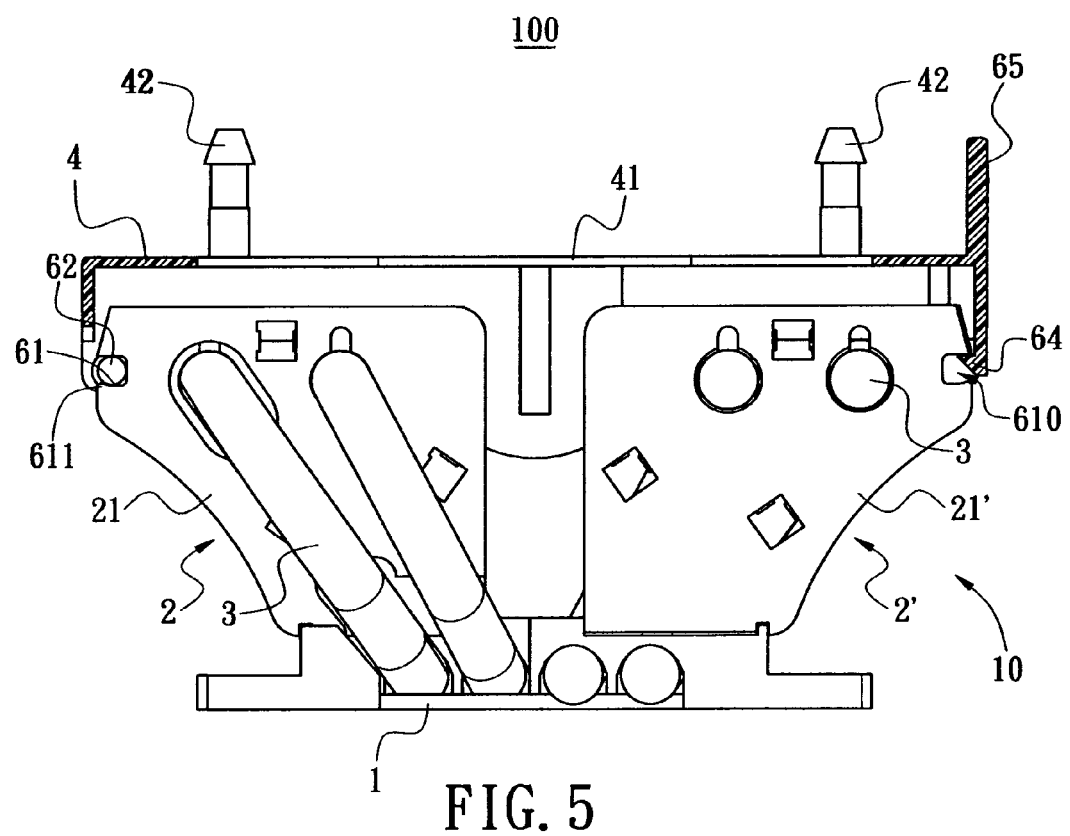
FIG. 5 shows a sectional view of the hood after assembling to the heat-dissipating device.

The dent 61 is of U-shape cross section and comprises a baffle 611 extended upward on bottom face thereof to shrink the opening thereof and to further retain the retaining rod 62, as shown in FIG. 5.

Figure 3:
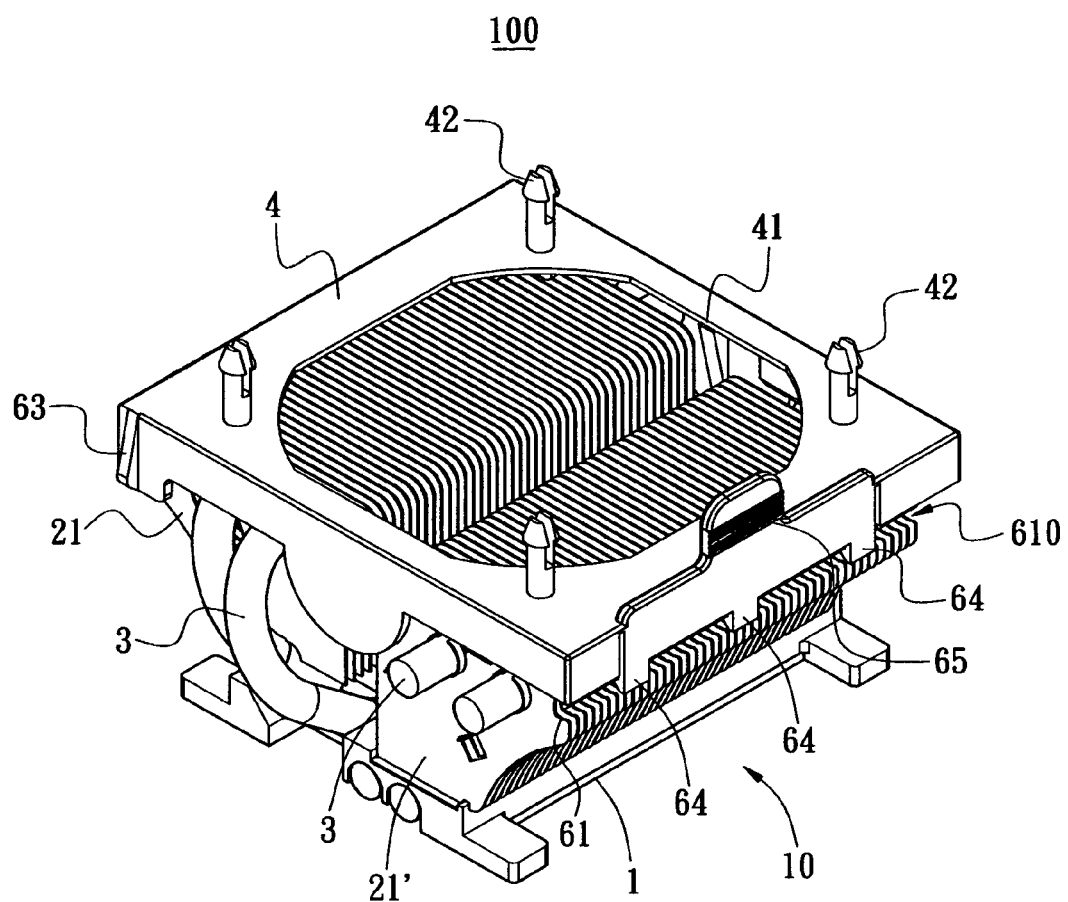
FIG. 3 shows a perspective view of the hood after assembling to the heat-dissipating device.
Figure 4:
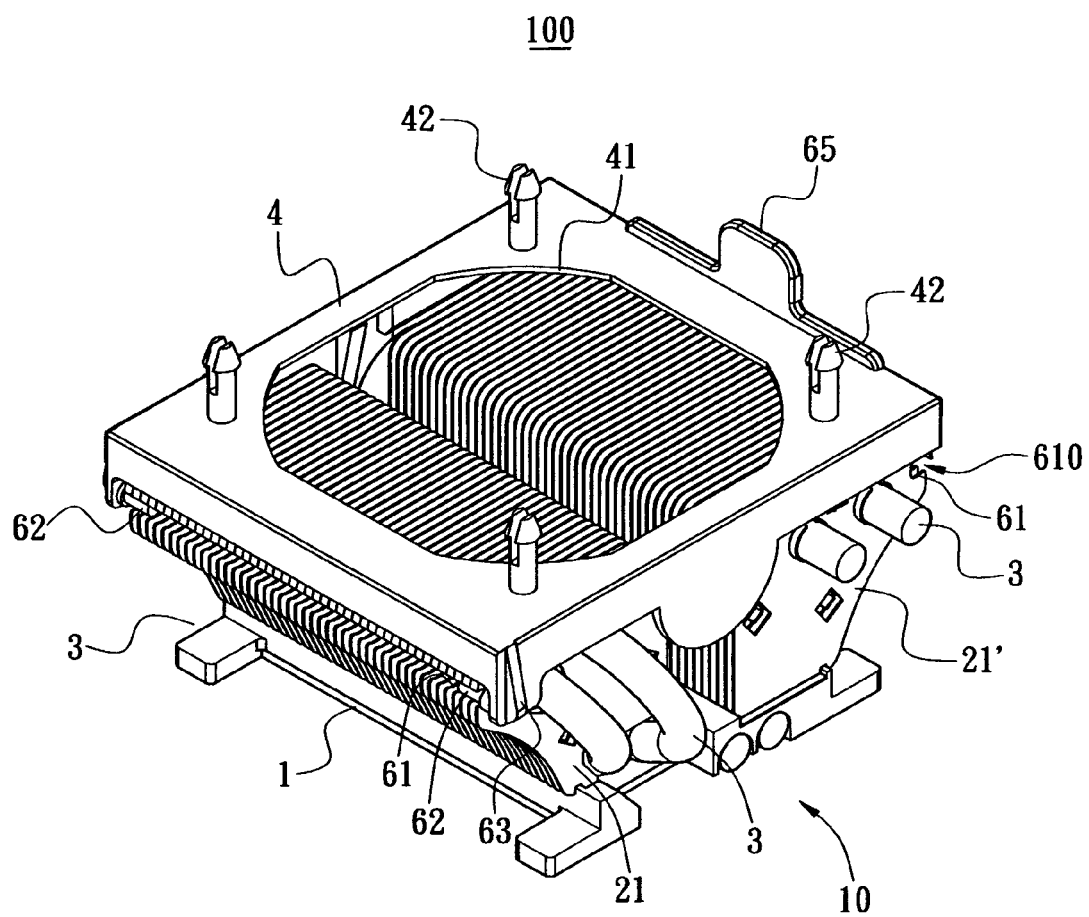
FIG. 4 shows another perspective view of the hood after assembling to the heat-dissipating device.

With reference to FIGS. 3 and 4, to retain the hood 4 atop the heat-dissipating device 10, the retaining rod 62 on one side of the hood 4 is first pivotally connected to the retaining groove 610 on one side of the heat-dissipating fins 21. Afterward, the retaining hook 64 on another side of the hood 4 is embedded into the other retaining groove 610 on one side of the heat-dissipating fins 21', thus retaining the hood 4 atop the heat-dissipating device 10, as shown in FIG. 5.

To disassemble the hood 4, the push tab 65 is pushed inward such that the retaining hook 64 below the push tab 65 is detached from the retaining groove 610 on one side of the heat-dissipating fins 21'. Afterward, the hood 4 is moved upward and outward such that the retaining rod 62 is detached from the other retaining groove 610 on one side of the heat-dissipating fins 21. In this way, the entire hood 4 is disassembled from the heat-dissipating device 10.

Figure 6:
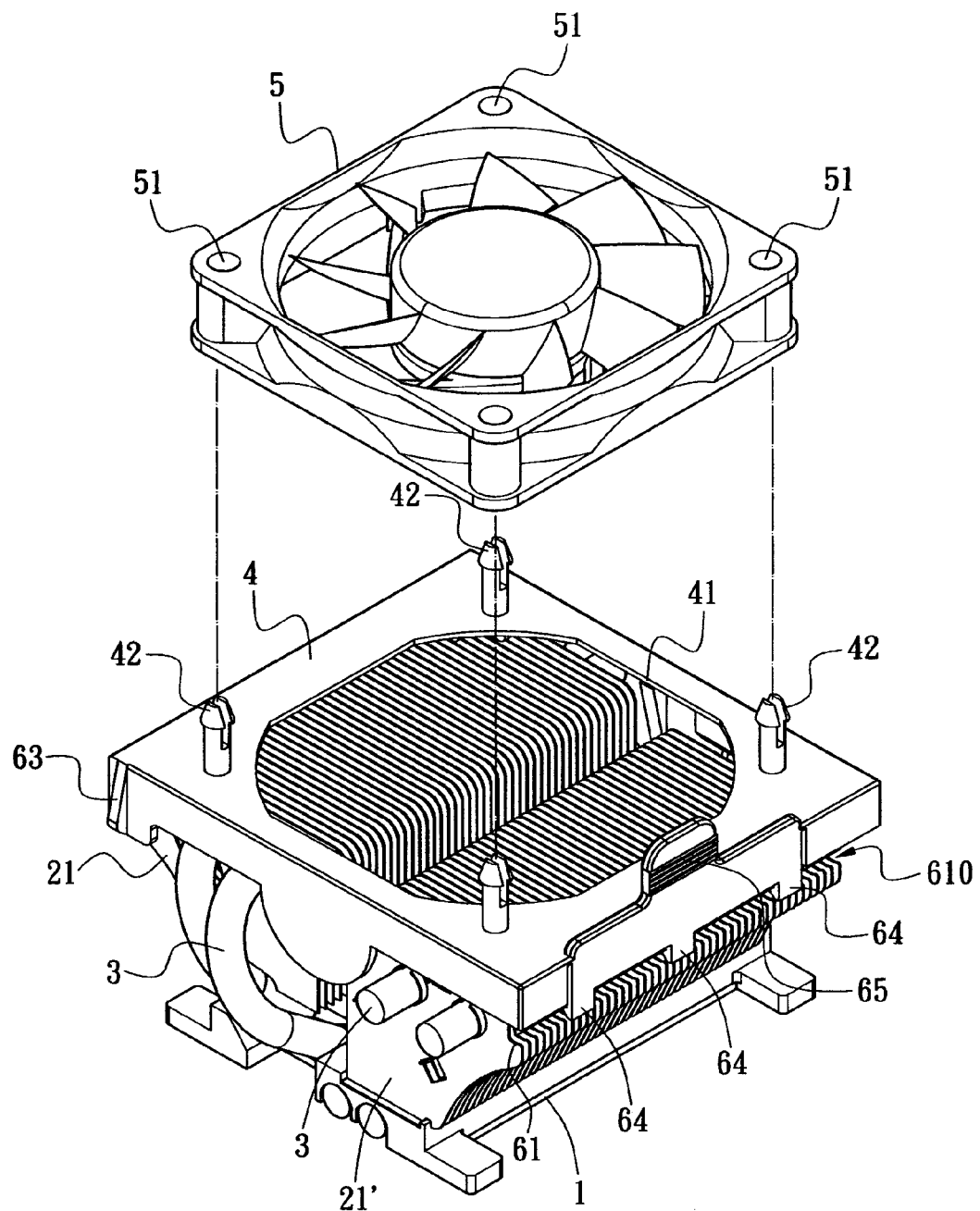
FIG. 6 is a perspective view to show the assembling of the fan on the heat-dissipating device.

With reference to FIG. 6, four guiding rods 42 are integrally formed on four top corners of the hood 4 and corresponding to the retaining hole 51 defined on the fan 5. To assemble the fan 5 on the hood 4, the guiding rods 42 pass corresponding retaining hole 51 to retain the fan 5. Therefore, the fan 5 can be easily assembled to and disassembled from the hood 4 without using bolt unit.

To sum up, the hood retaining structure for heat-dissipating device will fast assemble and disassemble the hood 4 to the heat-dissipating device 10 without using bolt unit.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A hood retaining structure for heat-dissipating device, the heat-dissipating device comprising a heat sink with two heat-dissipating fin sets, each heat-dissipating fin set comprising a plurality of heat-dissipating fins erected vertically, the hood retaining structure being arranged on the heat-dissipating fins to retain a hood thereon and a fan being able to retain to the hood, the hood retaining structure comprising:

a dent defined on an outer side of each heat-dissipating fin such that a retaining groove is defined on each heat-dissipating fin set after the heat-dissipating fins are assembled; and at least one retaining rod and at least one retaining hook provided on lateral sides of the hood, the retaining rod and the retaining hook being configured to lock into corresponding retaining groove, the retaining hook comprising a push tab.

2. The hood retaining structure for heat-dissipating device as in claim 1, wherein the heat sink comprises a heat-dissipating block and there are two heat-dissipating fin sets arranged on the heat-dissipating block, at least one heat pipe passes through the heat-dissipating fin sets and the heat-dissipating block.

3. The hood retaining structure for heat-dissipating device as in claim 1, wherein the dent has U-shaped cross section and comprises a baffle extended upward on bottom face thereof.

4. The hood retaining structure for heat-dissipating device as in claim 1, wherein the hood comprises rib corresponding to outer side of the retaining rod.

5. The hood retaining structure for heat-dissipating device as in claim 1, wherein the hood comprises guiding rods integrally formed on four top corners thereof.

* * * * *